United States Patent
Mahawili

(10) Patent No.: US 6,544,339 B1
(45) Date of Patent: Apr. 8, 2003

(54) RECTILINEAR WEDGE GEOMETRY FOR OPTIMAL PROCESS CONTROL IN CHEMICAL VAPOR DEPOSITION AND RAPID THERMAL PROCESSING

(75) Inventor: Imad Mahawili, Grand Rapids, MI (US)

(73) Assignee: Micro C Technologies, Inc., Kentwood, MI (US)

( * ) Notice: Subject to any disclaimer, the term of this patent is extended or adjusted under 35 U.S.C. 154(b) by 0 days.

(21) Appl. No.: 09/532,588

(22) Filed: Mar. 22, 2000

(51) Int. Cl.⁷ ............................................. C23C 16/00
(52) U.S. Cl. ...................................... 118/715; 118/725
(58) Field of Search ................................. 118/715, 730, 118/728, 725

(56) References Cited

U.S. PATENT DOCUMENTS

| | | | | |
|---|---|---|---|---|
| 3,696,779 A | * | 10/1972 | Murai et al. ................. | 118/725 |
| 4,476,158 A | | 10/1984 | Baumberger et al. ........ | 427/109 |
| 4,540,868 A | | 9/1985 | Liebing ........................ | 219/121 |
| 4,550,684 A | | 11/1985 | Mahawili ..................... | 118/724 |
| 4,596,718 A | | 6/1986 | Gruner .......................... | 427/34 |
| 4,680,447 A | | 7/1987 | Mahawili ..................... | 219/343 |
| 4,834,022 A | | 5/1989 | Mahawili ..................... | 118/725 |
| 4,993,358 A | | 2/1991 | Mahawili ..................... | 118/715 |
| 5,155,336 A | | 10/1992 | Gronet et al. ................. | 219/411 |
| 5,310,260 A | | 5/1994 | Schietinger et al. ......... | 374/142 |
| 5,317,492 A | | 5/1994 | Gronet et al. ................. | 362/294 |
| 5,366,002 A | | 11/1994 | Tepman .......................... | 165/1 |
| 5,453,124 A | | 9/1995 | Moslehi et al. .............. | 118/715 |
| 5,487,127 A | | 1/1996 | Gronet et al. ................. | 392/416 |
| 5,487,787 A | | 1/1996 | Cann et al. ................... | 118/723 |
| 5,490,728 A | | 2/1996 | Schietinger et al. ........... | 374/7 |
| 5,531,835 A | | 7/1996 | Fodor et al. .................. | 118/728 |
| 5,566,744 A | | 10/1996 | Tepman ....................... | 165/80.1 |
| 5,646,814 A | * | 7/1997 | Shamouilian et al. ........ | 361/234 |
| 5,710,407 A | * | 1/1998 | Moore et al. ................. | 219/405 |
| 5,746,875 A | * | 5/1998 | Maydan et al. .............. | 156/345 |
| 5,814,365 A | | 9/1998 | Mahawili ...................... | 427/10 |
| 5,951,896 A | | 9/1999 | Mahawili ..................... | 219/411 |
| 5,955,383 A | | 9/1999 | Hwang ......................... | 438/729 |
| 6,007,635 A | | 12/1999 | Mahawili ..................... | 118/728 |
| 6,090,212 A | | 7/2000 | Mahawili ..................... | 118/728 |

FOREIGN PATENT DOCUMENTS

| | | |
|---|---|---|
| EP | 0538092 | 10/1992 |
| JP | 9-63967 | * 3/1997 |
| WO | WO8503460 | 8/1985 |

OTHER PUBLICATIONS

English Translation of JP 9–63967.*
European Search Report for EP 00 65 0148 dated Jul. 6, 2001, which corresponds to the present application.
Japanese Patent Abstract for Document No. 9063967 dated Jul. 3, 1997.

* cited by examiner

*Primary Examiner*—Gregory Mills
*Assistant Examiner*—Sylvia R. MacArthur
(74) *Attorney, Agent, or Firm*—Van Dyke, Gardner, Linn & Burkhart, LLP

(57) ABSTRACT

A processing reactor for processing semiconductor substrates includes a reactor housing, which defines a processing chamber, and a platform which is rotatably supported in the reactor housing for supporting a substrate in the processing chamber. The processing reactor further includes a gas injection assembly which is adapted to inject at least one gas into the processing chamber. The gas injection assembly has a substrate facing surface, which is adapted to vary the dynamic pressure in the processing chamber to vary the processing time of the semiconductor substrate in the processing chamber. For example, gas injection assembly may include a gas injection manifold, which includes the substrate facing surface. Preferably the substrate facing surface is repositionable in the processing chamber to vary the dynamic pressure in said processing chamber.

59 Claims, 5 Drawing Sheets

RECTILINEAR WEDGE GEOMETRY FOR OPTIMAL PROCESS CONTROL IN CHEMICAL VAPOR DEPOSITION AND RAPID THERMAL PROCESSING

BACKGROUND AND TECHNICAL FIELD OF THE INVENTION

The present invention relates to a processing reactor and, more particularly, to a processing reactor for the thermal processing and chemical deposition of thin film applications on a substrate, such as semiconductor wafer, in which the injection of gas into the chamber can be controlled to provide better control of the substrate processing.

In semiconductor fabrication, gases are injected in the chamber in order to deposit thin films on the substrate. Typically, the substrate is heated during the deposition process and during various other temperature activated processes for example, oxide growth, etching, and thermal annealing. The control of the deposition depends on the control of the gas flow and dynamic pressure, and the wafer temperature. Uniform wafer temperatures provide uniform process variables on the substrate; for instance in film deposition, if the temperature in one region of the substrate varies from another region, the thickness of the deposition in these regions may not be equal. Moreover, the adhesion of the deposition to the substrate may vary as well. Furthermore, if the temperature in one region of the substrate is higher or lower than the temperature in another region of the substrate, a temperature gradient within the substrate material is formed. This temperature gradient produces thermal moments in the substrates which in turn induce radial local thermal stresses in the substrate. These local thermal stresses can reduce the substrate's strength and, furthermore, damage the substrate. Uniform heating, however, has been recently achieved by a new and improved heater assembly disclosed in U.S. Pat. No. 5,951,896 issued Sep. 14, 1999, and commonly assigned to Micro C Technologies, Inc. of Grand Rapids, Mich., the disclosure of which is herein incorporated by reference in its entirety.

In addition to temperature uniformity, the uniformity of film deposition is affected by the uniformity of the delivery of the process gas. Good process uniformity usually requires adjustments and optimizations for both the wafer temperature uniformity and the gas flow pattern of the process gas. In most conventional chambers or reactors, the reactant gas is delivered through a single port, which injects gas into the chamber above the wafer. Due to the geometry of the wafer, the resulting deposition of the gas onto the wafer is not uniform.

In order to provide improved delivery of the gas, shower-like gas injection systems have been developed in which separate gases are injected in a shower-like pattern over the entire substrate area. However, such gas delivery systems fill the entire chamber volume and, thus, deposit films on the chamber walls in addition to the substrate. Other solutions have included injecting gas radially inward to the substrate across circular contoured plates positioned adjacent the substrate, for example as disclosed in U.S. Pat. No. 4,834,022, the disclosure of which is herein incorporated by reference in its entirety. However, this inward radial injection system provides less control of the gas injection over larger substrates. With the increase in size of the substrates which are now being manufactured, this radial injection system is not as effective.

More recently, an improved gas delivery system (disclosed in U.S. Pat. No. 5,814,365, commonly assigned to Micro C Technologies, Inc. of Grand Rapids, Mich., the disclosure of which is hereby incorporate by reference in its entirety) has been developed which directs one or gases onto a discrete area of the substrate, which better controls the gas delivery onto the substrate. With increased control of gas delivery, however, it is believed that further optimizations can be achieved by better controlling the dynamic pressure in the processing chamber.

Consequently, there is a need for a processing reactor which can deliver and direct the flow of reactant gas or gases onto the substrate during processing in a uniform manner and, further, achieve even greater control over the gas flow within the reactor's processing chamber so that the film or films deposited on the substrate have a substantially uniform thickness across the device side of the substrate.

SUMMARY OF THE INVENTION

According to the present invention, a reactor for processing semiconductor substrates includes a gas injection system that injects gas in a manner to form a film or films on the substrate that have more uniform thickness, especially on larger substrates on the order of up to 300 mm or greater.

In one form of the invention, a reactor includes a reactor housing defining a processing chamber and an improved gas injection system. The reactor further includes a platform which is rotatably supported in the reactor housing for rotatably supporting the substrate in the processing chamber. The gas injection assembly is adapted to inject at least one gas into the processing chamber and onto the substrate when the platform rotates the substrate. The gas injection assembly has a substrate facing surface, which is adapted to vary the dynamic pressure in the processing chamber to vary the processing time of the substrate in the processing chamber.

In one aspect, the substrate facing surface is repositionable in the processing chamber to vary the dynamic pressure in the processing chamber. For example, the gas injection assembly may include a gas injection manifold, which includes the substrate facing surface. Preferably, the gas injection manifold is movably mounted in the housing to vary the dynamic pressure in the processing chamber.

In other aspects, the substrate facing surface includes at least one angled portion with respect to the platform, with the angled portion varying the dynamic pressure in the processing chamber. Furthermore, the substrate facing surface may include a second angled portion. In preferred form the angled portions are joined to form an apex. The apex is preferably centrally aligned over the substrate.

In yet another aspect, the gas injection assembly includes at least one port for injecting a first gas into the processing chamber. The port is preferably located in the substrate facing surface and, further, is centrally located in the substrate facing surface. In further aspects, the gas injection assembly includes a second port for injecting a second gas into the processing chamber. For example, the first port and the second port may be coaxial.

According to another form of the invention, a processing reactor for processing a semiconductor substrate includes a housing and a platform rotatably supported in a processing chamber defined in the housing for rotatably supporting the substrate in the processing chamber of the reactor. The reactor further includes a heater and a gas manifold. The gas manifold includes a substrate facing surface and at least one injection port for injecting gas axially onto the substrate. The substrate facing surface is adapted to vary the dynamic pressure in the processing chamber to vary the processing time for the substrate.

In one aspect, the substrate facing surface is repositionable in the processing chamber to vary the dynamic pressure in the processing chamber. Preferably, the substrate facing surface includes first and second portions, with at least one of the first and second portions being angled with respect to the platform.

In other aspects, the housing includes a cover. The gas manifold is supported in the cover and preferably removably supported in the cover to permit repositioning of the substrate facing surface relative to the platform. In further aspects, the substrate facing surface includes first and second portions that are angled to form a positive wedge-shaped substrate facing surface, preferably a positive rectilinear wedge-shaped surface. Alternately, the first and second angled portions are angled to form a negative rectilinear wedge-shaped substrate facing surface.

According to yet another form of the invention, a processing reactor for processing a semiconductor substrate includes a reactor housing, a heater housing rotatably supported in the reactor housing, and a platform supported on the heater housing for rotatably supporting the substrate in the processing chamber of the reactor. A heater is positioned in the heater housing and is adapted to heat the substrate. The reactor further includes a gas manifold that has a substrate facing surface and at least one gas injection port for injecting gas axially onto the substrate through the substrate facing surface, with the substrate facing surface being adapted to vary the dynamic pressure in the processing chamber to vary the processing time for the substrate.

In other aspects, the gas manifold is supported in a gas injection assembly housing, which supports the gas manifold in the reactor housing. The gas injection assembly housing includes a transverse passage, with the gas manifold being positioned and supported in the transverse passage. Preferably, the gas manifold is movably supported in the transverse passage.

In yet other aspects, the gas injection assembly housing further supports a gas exhaust manifold for exhausting gases from the processing chamber. Preferably, the gas exhaust manifold extends around the gas injection manifold to isolate gas injected through the gas injection port on a discrete area of the substrate.

As will be understood, the reactor of the present invention provides numerous advantages over prior known reactors. The reactor provides a gas injection system which directs one or more reactant gases to the substrate during processing in a controlled manner and directs the gas or gases to discrete regions of the substrate under controlled dynamic pressures so that the film or films deposited on the substrate are more uniform.

These and other objects, advantages, purposes and features of the invention will be apparent to one skilled in the art from a study of the following description taken in conjunction with the drawings.

DESCRIPTION OF THE PREFERRED EMBODIMENTS

Figure 1:
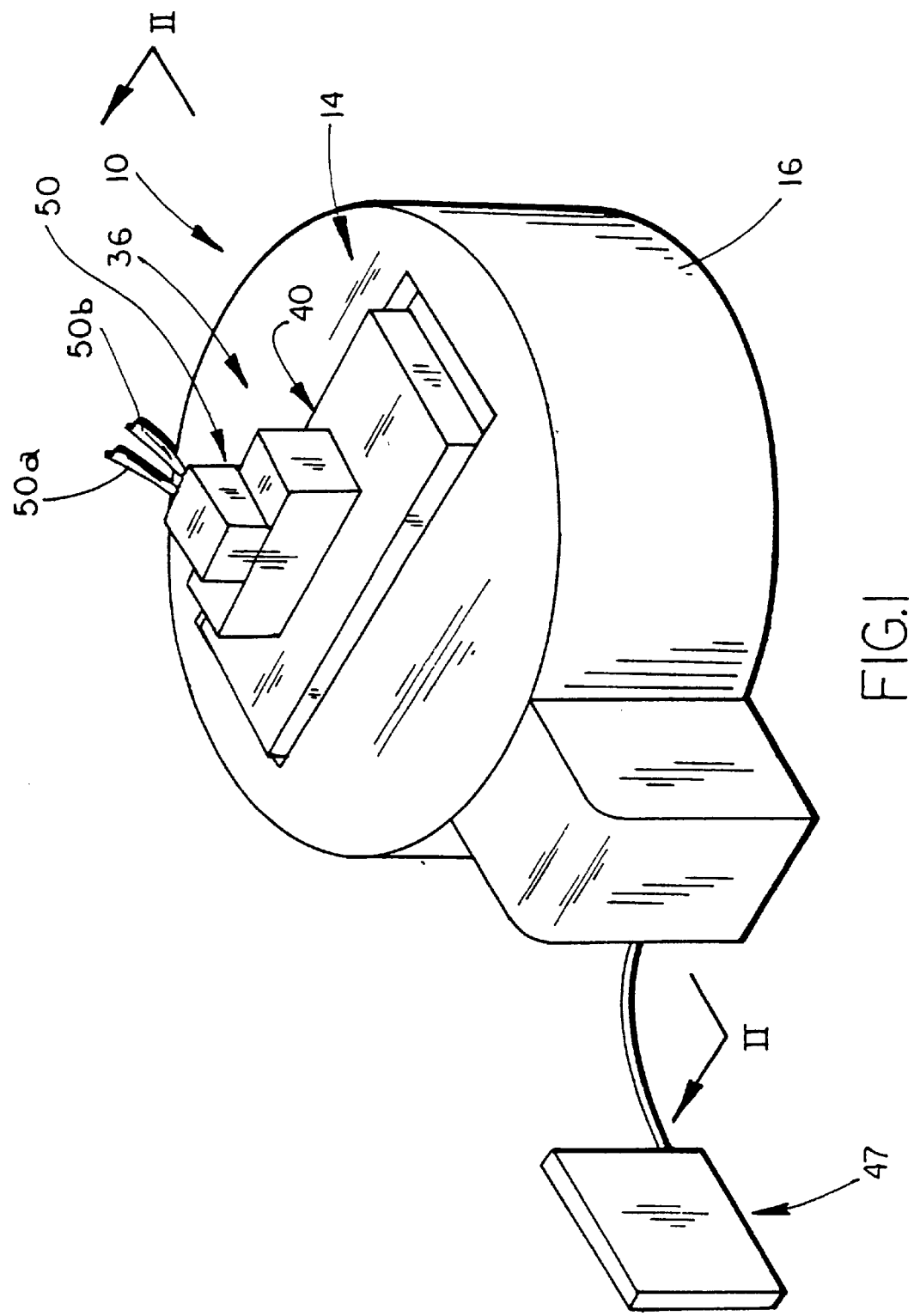
FIG. 1 is a perspective view of a reactor of the present invention.
Figure 2:
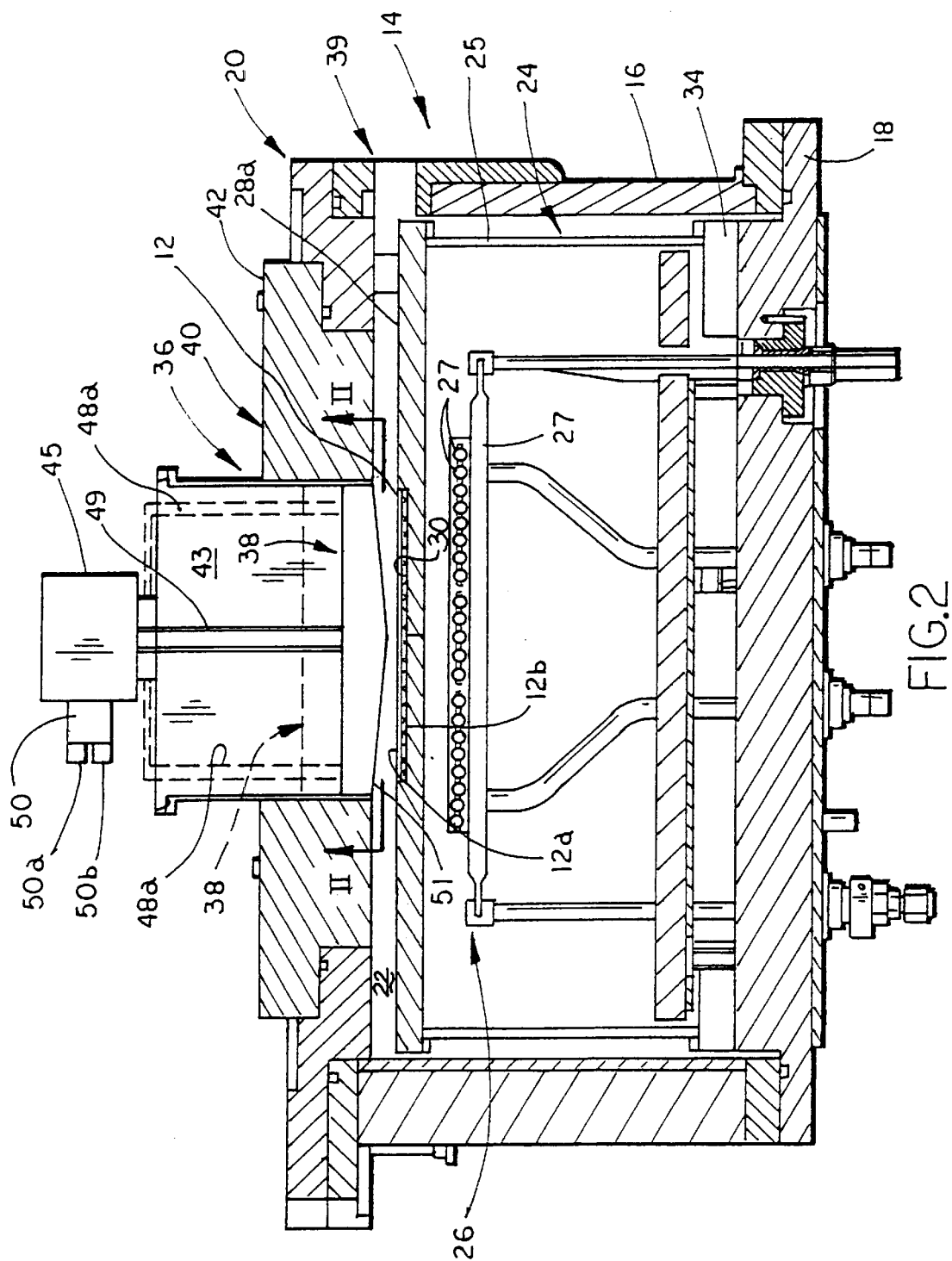
FIG. 2 is a schematic sectional view taken along line II—II of FIG. 1 illustrating the reactor of FIG. 1 incorporating a gas injection system of the present invention.

Referring now to the drawings and in particular to FIGS. 1 and 2, the numeral 10 generally designates a reactor that incorporates a gas injection system 36 of the present invention which is particularly suitable for processing semiconductor substrates. In the illustrated embodiment, reactor 10 comprises a single wafer processing reactor that is suitable for performing various fabrication processes on a semiconductor substrate 12, such as a semiconductor wafer, including chemical vapor deposition of thin film applications, for example high temperature oxide, low temperature oxide, high temperature nitride, doped and undoped polysilicon, silicon epitaxial and tungsten metal and tungsten silicide films, and thermal processing, such as thermal annealing and thermal reflow of boro-phosphorous gases. The control of these processes depends on the control of gas flow, gas pressure, and wafer temperature. As will be more fully described below, gas injection system 36 provides a for uniform delivery of gas onto the substrate and, further, provides for enhanced control of the flow of the gas across the substrate and the dynamic pressure in the processing chamber which results in a more uniform film application on the substrate.

As best seen in FIG. 2, reactor 10 includes a housing 14 which is formed by a cylindrical wall 16, a base 18, and a cover 20 which together define a processing chamber 22. Rotatably supported on base 18 is a second or heater housing 24, which houses and effectively isolates a heater assembly 26. Heater assembly 26 is used to heat substrate 12 from the non-device side 12b, as will more fully described below. Heater housing 24 includes a cylindrical wall 25 and a platform 28, which rotatably supports semiconductor substrate 12 in processing chamber 22 and further rotates substrate 12 during processing to assure a more uniform distribution of heat across non-device side 12b and of process gases onto device side 12a of substrate 12. Preferably, platform 28 includes a central recessed support surface 30, with a central opening, which supports substrate 12 generally flush with an upper surface 28a of platform. Preferably, recessed support surface 30 is sized to permit unimpeded thermal expansion of substrate 12 during processing.

Heater assembly 26 is designed to deliver radiant heat to substrate 12 in a manner such that the temperature in the substrate is substantially uniform. Preferably heater assembly 26 includes a plurality of lamps 27 which are supported in a tier arrangement below platform 28 and substrate 12 so as to produce a varied heat profile across the width of substrate 12 such that more heat is delivered to the perimeter than the central portions of the non-device side 12b of substrate 12 which results in uniform heating of substrate 12. A suitable example of a heater assembly is described in U.S. Pat. No. 5,951,896 entitled RAPID THERMAL PROCESSING HEATER TECHNOLOGY AND METHOD OF USE, which is commonly assigned to Micro C Technologies, Inc. of Grand Rapids, Mich., the entire disclosure of which is incorporated by reference herein in its entirety.

Platform 28 may comprise a number of different configurations but preferably comprises a platform which isolates non-device side 12b of substrate 12 from the process gases and, further, isolates heater assembly 26 from the process gases while permitting heat from heater assembly 26 to uniformly heat substrate 12. For details of examples of preferred embodiments of platform 28, reference is made to U.S. Pat. No. 6,007,635 and pending U.S. Pat. applications entitled A SUBSTRATE PLATFORM FOR A SEMICONDUCTOR SUBSTRATE DURING RAPID HIGH TEMPERATURE PROCESSING AND METHOD OF SUPPORTING A SUBSTRATE, filed on Aug. 15, 1997, Ser. No. 08/912,242, now U.S. Pat. No. 6,090,212; and A PLATFORM FOR SUPPORTING A SEMICONDUCTOR SUBSTRATE AND METHOD OF SUPPORTING A SUBSTRATE DURING RAPID HIGH TEMPERATURE PROCESSING, filed on Oct. 18, 1999, Ser. No. 09/419,555, by Imad Mahawili, Ph.D., all commonly assigned to Micro C Technologies, Inc. of Grand Rapids, Mich., the disclosures of which are incorporated herein by reference in their entireties.

Heater housing 24 also includes a base 34 which is preferably rotatably supported in housing 14 on base 18 and is preferably rotated using a conventional magnetically coupled drive mechanism or other suitable driving devices which can impart rotation to housing 24 and base 34 through a vacuum seal. In this manner, platform 28 rotates substrate 12 to provide a uniform application of reactant gases and heat over its entire surface, as would be understood by those skilled in the art. The revolutions per minute (rpm) of base 34 and housing 24 may be preset, for example preferably in a range of 5 to 60 rpm depending on the specific process, again is understood by those skilled in the art. Platform 28 can accommodate various substrate sizes and, in particular, can accommodate substrates with 150, 200 and 300 mm diameters or greater.

Preferably, substrate 12 is placed into evacuated chamber 22 through a chamber valve 39 and is placed on platform 26 by a conventional wafer transport device (not shown), such as an automatic transport robot as is known in the art. After substrate 12 is placed in processing chamber 22, process chamber 22 is preferably evacuated through a vacuum exhaust port provided in gas injector assembly 36, as will be more fully described below.

As note above, reactor 10 is suitable for performing various fabrication processes on semiconductor substrate 12, such as chemical vapor deposition of thin film applications, including high temperature oxide, low temperature oxide, high temperature nitride, doped and undoped polysilicon, silicon epitaxial and tungsten metal and tungsten silicide films, and thermal processing, including thermal annealing and thermal reflow of boro-phosphorous gases. As best seen, gas injection assembly 36 is preferably a modular assembly which is removably supported in cover 20 to permit cleaning or replacement of gas injection assembly 36. Gas injection assembly 36 includes a gas injection manifold 38 and a housing 40. Gas injection manifold 38 injects one or more gases onto the device side 12a of substrate 12 where it is desired that thin film deposition takes place.

Figure 3:
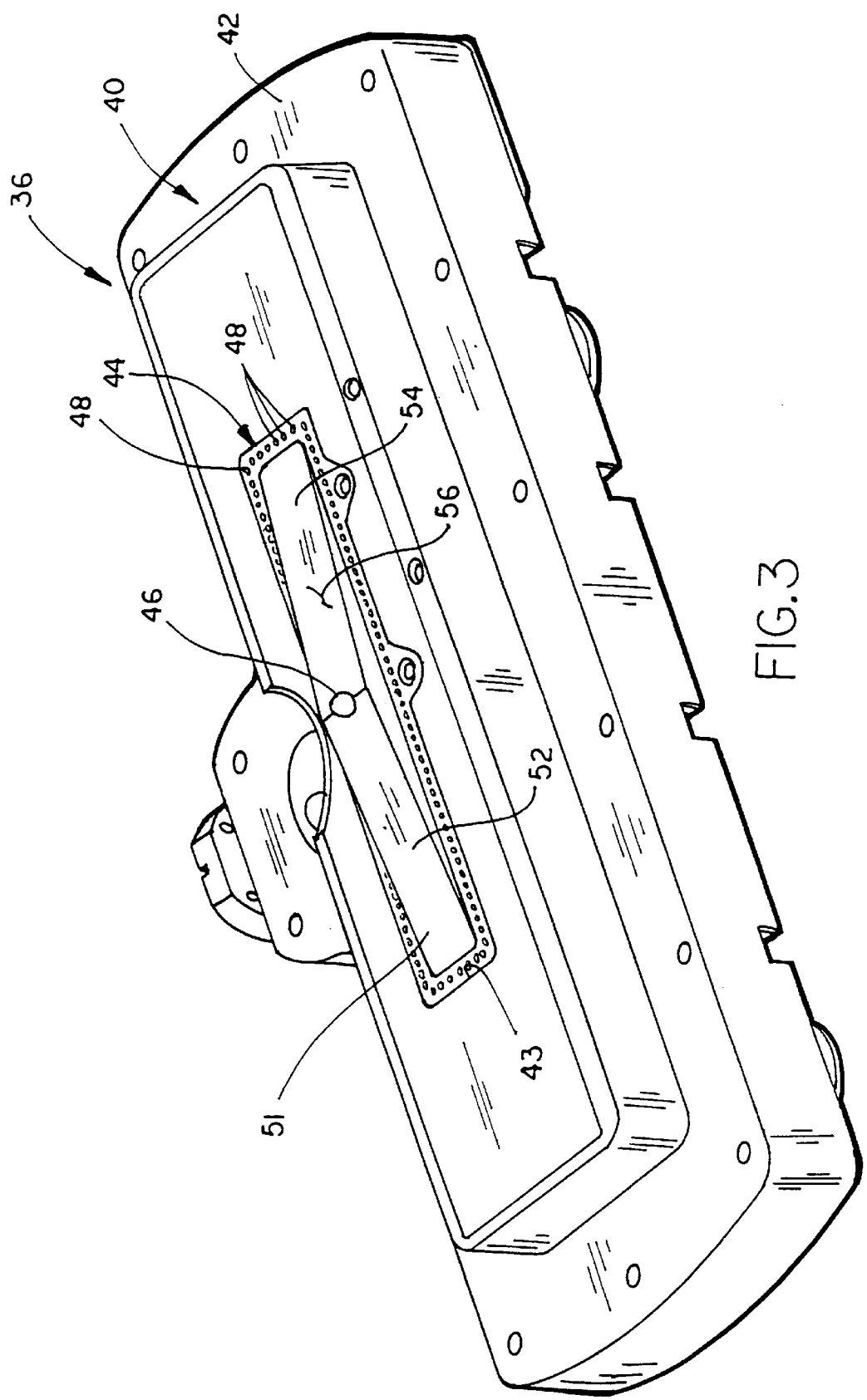
FIG. 3 is an enlarged bottom plan view taken along line III—III of FIG. 2 illustrating a gas injection manifold of the gas injection system of FIG. 2.

Referring to FIGS. 2 and 3, housing 40 includes a mounting flange 42 and a central transverse passageway 43 that extends through housing 40 in which manifold 38 is positioned. Manifold 38 is preferably movably mounted for extension to an extended position (shown in solid in FIG. 2) and for retraction to a plurality of retracted positions (one shown in phantom in FIG. 2). In this manner, manifold 38 may be repositioned as desired to increase or decrease the dynamic pressure in process chamber 22 which varies the deposition rate and, therefore, varies the residence time. Manifold 38 is preferably moved through passageway by a computer controlled drive mechanism 45, such as a computer controlled servo motor. It should also be understood, injection system 36 may alternately include a fixed manifold 30.

Referring again to FIG. 3, manifold 38 includes at least one injection port 46 through which the process gas is injected into chamber 22. Gases are delivered to injection port 46 via tubing 49 which extends from port 46 through passageway 43 to a valve manifold 50 supported exteriorly of housing 40. Gas is delivered to valve manifold 50 through one or more inlets 50a, 50b. In addition, gas injection assembly 36 preferably includes an exhaust manifold 44 which extends around injection manifold 38 and includes a plurality of ports 48 for exhausting gases from chamber 22 so that gases directed onto substrate 12 are confined to a discrete area across the substrate, which preferably extends from one side or edge of the substrate to an opposed side or edge of substrate 12. Ports 48 are in fluid communication with one or more conduits 48a which may be similarly coupled to valve manifold 50 to which a vacuum line can be coupled for exhausting gases from processing chamber 22. As would be understood by those skilled in the art, ports 48, therefore, may be used to control the dynamic pressure in processing chamber 22 and to maintain a desired vacuum in the chamber 22 and, as a result, control the flow of process gases across substrate. In addition to removing unreacted gases from processing chamber 22, exhaust manifold 44 also assists in the prevention of back flow contamination of the reactant gases. It should be understood that ports 48 may also be used to inject inert gases to further control the direction of gas flow from port 46.

As best seen in FIG. 3, injection manifold 38 is generally rectangular in shape and includes a generally rectangular substrate facing side 51. Side 51 includes one or more angled portions 52, 54 which are angled with respect to platform 28 and, therefore, to device side 12a of substrate 12. Manifold 38 is preferably a solid body formed from a suitable material for the particular processing requirements, for example quartz, stainless steel, which may or may not include internal water cooling, or the like. Port 46 extends through the manifold body and is preferably located at the juncture of angled portions 52 and 54 and, more preferably, also centrally located over substrate 12, with angled portions 52 and 54 having substantially equal lengths or radial extents. Angled portions 52 and 54 preferably have planar surfaces and, in the illustrated embodiment, form a positive rectilinear wedge shape surface 56 which varies the dynamic pressure across substrate 12 in processing chamber 22. With a positive rectilinear wedge shape surface in which the center or apex of the wedge is closer to substrate 12, the rate of film deposition increases and, therefore, the residence time decreases. By varying the shape of the surface of manifold 38, the dynamic pressure in chamber 22 can be modified and, therefore, the gas flow velocity field above the wafer can be controlled in a manner to vary the processing time and, further, to achieve more uniform film deposition thickness during chemical vapor deposition or rapid thermal processing. For example, with a single gas feed in the center of facing side 51, port 46 can be used for injection of oxygen for the growth of rapid thermal oxide at elevated temperatures. In addition, port 46 can be used to inject plasma activated gas species from a remote plasma excitation tube as described in co-pending U.S. Pat. application entitled REACTOR WITH REMOTE PLASMA SYSTEM AND METHOD OF PROCESSING A SEMICONDUCTOR SUBSTRATE, Attorney Docket No. MIC04 P-106, filed Jan. 19, 2000, by Imad Mahawili, Ph.D., commonly assigned to Micro C Technologies, Inc., the disclosure of which is herein incorporated by reference in its entirety.

Control of gas injection assembly 36, drive mechanism 45, and heater assembly 26 is preferably achieved using a central controller 47(FIG. 1), such as a PLC or computer. In addition, controller 47 may be used to actuate and control the magnetic drive which rotates base 34, and other systems in reactor 10 as would be understood by those skilled in the art.

Figure 4:
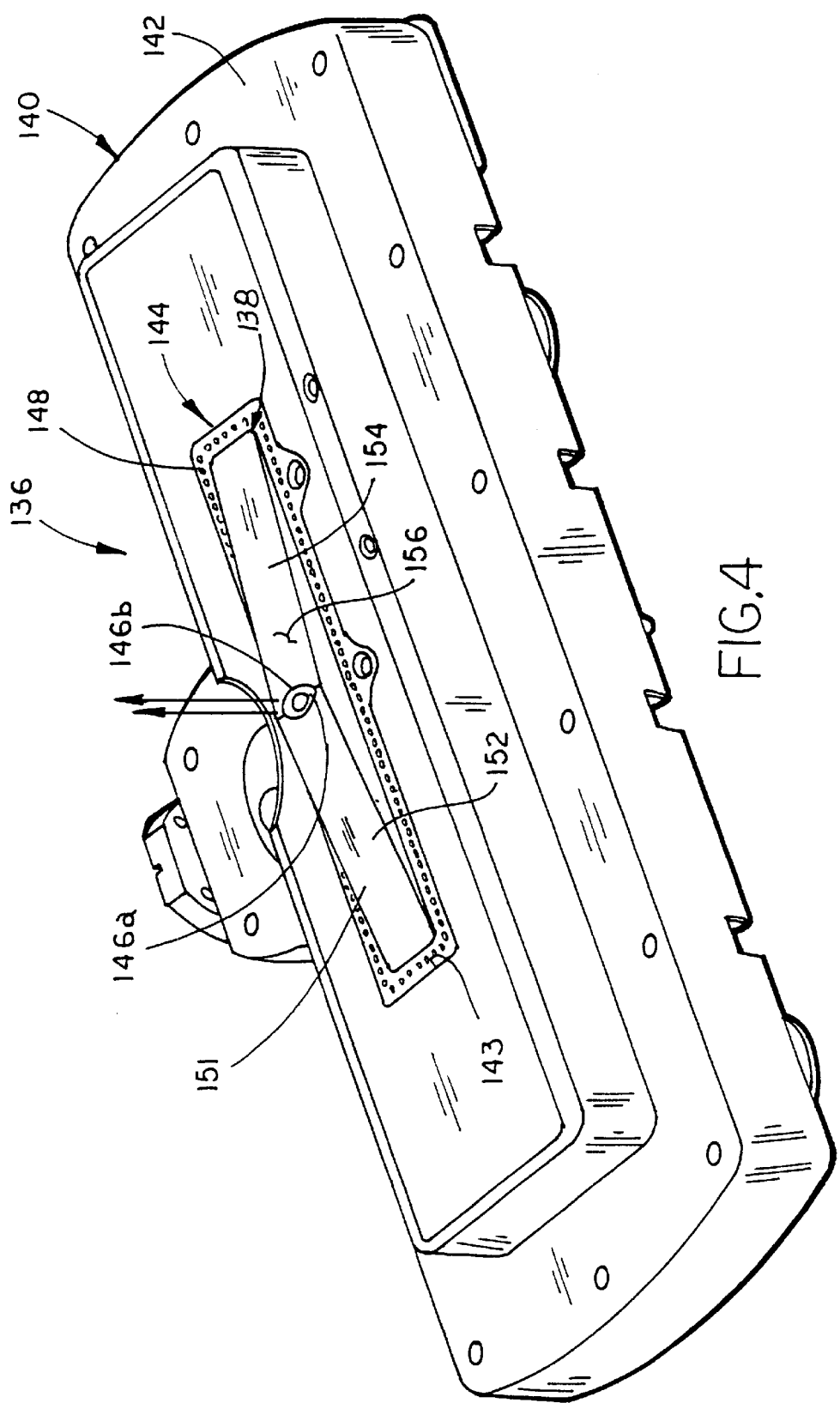
FIG. 4 is a view similar to FIG. 3 illustrating a second embodiment of the gas injection manifold of the gas injection system of the present invention.

Referring to FIG. 4, a second embodiment of injection assembly 136 is illustrated. Injection assembly 136 is of similar construction to injection assembly 36 and includes a housing 140 which positions injection assembly 136 in cover 20 of reactor 10, similar to the previous embodiment. Housing 140 includes a mounting flange 142 which rests on cover 20, and a central transverse passageway 143 in which manifold 138 is positioned and, preferably, movably mounted for extension and for retraction, similar to the previous embodiment. Similar to gas injection assembly 36, gas injection assembly 136 includes an exhaust manifold 144 which extends around injection manifold 138 and similarly includes a plurality of ports 148 for exhausting gases from chamber 22 so that the gas or gases directed onto substrate 12 are confined to a discrete area across the substrate and, further, to control the vacuum in processing chamber 22.

In the illustrated embodiment, injection manifold 138 includes a pair of concentric or coaxial injection ports 146a and 146b. Ports 146a and 146b may be used, for example, for chemical deposition requiring two gases for the deposition of the thin film on substrate 12. For example, the center or inner port 146a may be used to inject silane, with the outer port 146b used to inject oxygen in order to form depositions of silicon dioxide on substrate 12. Alternately, center port 146a may be used to inject silane, with outer port 146b being used to inject ammonia to form silicon nitride on substrate 12.

Similar to the first embodiment, manifold 138 has a generally rectangular shaped body with a generally rectangular substrate facing side 151 that includes first and second angled portions 152 and 154. Together, portions 152 and 154 form a positive rectilinear wedge-shaped surface similar to surface 56 of manifold 38. It should be understood that in some applications where decreased dynamic pressure is desired, surface 156 or 56 may comprise a negative rectilinear wedge-shape which results in a decrease in the dynamic pressure above substrate 12. A decrease in dynamic pressure would slow the film deposition rate and extend the residence time, which may be desirable in some applications.

Figure 5:
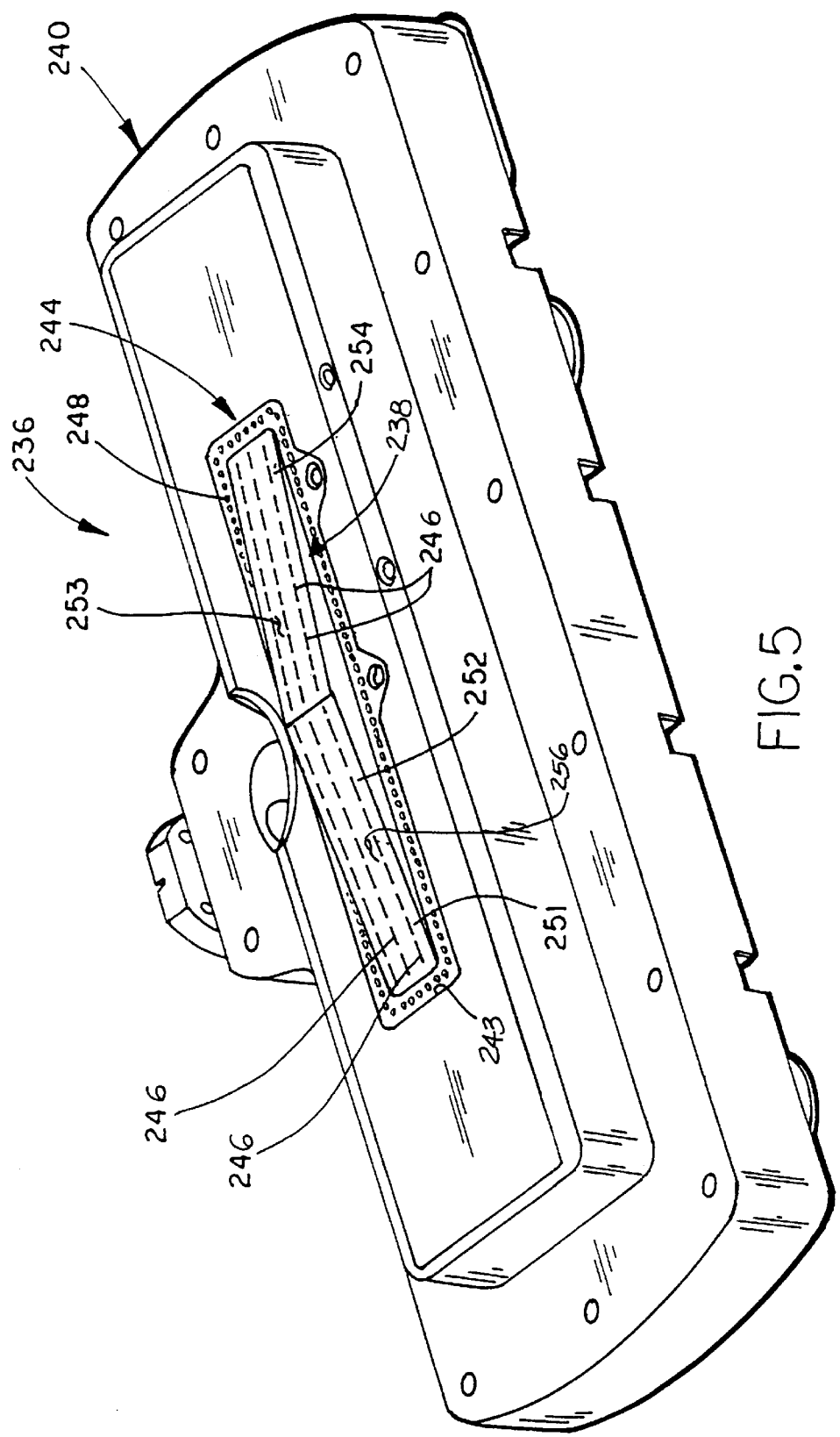
FIG. 5 is a view similar to FIG. 3 illustrating a third embodiment of the gas injection manifold the gas injection system of the present invention.

Referring to FIG. 5, a third embodiment of gas injection assembly 236 is illustrated. Gas injection assembly 236 is of similar construction to gas injection assemblies 36 and 136 and includes a gas injection manifold 238 supported in a housing 240. Housing 240 includes a mounting flange 242 for positioning gas injection assembly 236 in cover 20 of reactor 10. Manifold 238 is similarly movably supported in a transverse passageway 243 of housing 240 and is surrounded by an exhaust manifold 244 which includes a plurality of exhaust ports 248.

Similar to the previous embodiments, gas injection manifold 238 includes a substrate facing side 251 which includes at least two angled portions 252 and 254, which are preferably angled to form either a positive rectilinear wedge-shape facing surface 256 or a negative wedge-shape facing surface as previously described. With a positive rectilinear wedge-shape facing surface 246, the dynamic pressure is increased in processing chamber 22 such that the deposition rate of the film on substrate 12 is increased and, therefore, the processing time is decreased for a given film thickness. In the illustrated embodiment, injection manifold 238 includes a plurality of injection ports 246. Injection ports 246 may be arranged in a number of different configurations. For example, ports 246 may be arranged in a plurality of rows and columns. Optionally, one or more rows or columns can be allocated to inject a first gas, with other rows or columns or groups being allocated to inject a second gas. It should be understood, that gas injected by gas injection ports 246 are directed in the general direction of substrate 12 and any stray gas molecules which migrate near the region under exhaust manifold 244 will be exhausted from processing chamber 22. Therefore, the gas or gases introduced by gas injection ports 246 are confined to a discrete volume of processing chamber 22 and, furthermore, onto a discrete area or region of substrate 12. In addition, ports 246 may be arranged in a non-uniform pattern across side 251. For example, the density of ports 246 may be increased at the outer portions of side 251 and decreased over the central portion of side 251 to provide a variable gas injection profile across substrate 12. Preferably, manifold 238 is a quartz, stainless steel manifold, or a water cooled stainless steel manifold.

It should be understood that controls may be used to adjust the sequence of gas flowing from ports 246. Moreover, each port 246 may be coupled to a valve or regulator which may be adjusted using conventional controls to vary the flow of gas from each port. Furthermore, as reactive gases are turned off from a particular port, an inert gas may be injected into that port to control the reaction and conditions of the surface of substrate 12 and to prevent any back flow contamination of reactants. It should be understood by those skilled in the art that a wide variety of gases can be employed and selectively introduced through ports 246, for example hydrogen, argon, tungsten, hexaflouride, or the like to process substrate 12. In combination, ports 246, exhaust manifold 244, and facing side 251, vary the dynamic pressure in chamber 22 and, therefore, control the film deposition on substrate 12 in a manner which results in a more uniform film thickness.

It should also be understood, that other devices may be incorporated into reactor 10, for example a non-contact emissivity measurement system described in U.S. Pat. No. 5,814,365, which is commonly assigned to Micro C Technologies, Inc. of Grand Rapids, Mich., the disclosure of which is incorporated by reference herein in its entirety. In addition, the angled portions of the manifold can be offset from the center, with the single port or coaxial ports being offset from the juncture of the angle portions to maintain the central positioning of the port or ports over substrate or offset from the juncture resulting in the port or ports being offset from the central portion of the substrate. Furthermore, the substrate facing side may be planar without any angled portions—in which case, the dynamic pressure in chamber 22 may be adjusted by moving the injection manifold in passageway 43—or the substrate facing side may include more than two portions, with two or more portions comprising angled portions. Other variations include the manifold mounted on a pair of rods that are driven by computer controlled mechanism 45 or may be supported on cylinders, such as pneumatic cylinders, which are controlled by controller 47 (FIG. 1).

The specific devices and methods illustrated in the attached drawings, and described in the specification, are simply exemplary embodiments of the inventive concepts defined in the appended claims. Hence, other physical characteristics relating to the embodiments disclosed herein are not to be considered limiting unless the claims expressly state otherwise. While several forms of the invention have been shown and described, other forms will now become apparent to those skilled in the art. For example, as noted, injection manifolds 38, 138, 238 may be fixed or movably mounted to their respective housings. In addition, it can be appreciated that facing surface side 51, 151, 251 of manifolds 38, 138, 238 may be planar and yet still achieve an increase in dynamic pressure in processing chamber 22 to enhance control over the film deposition rate and thickness onto substrate 12. Therefore, it will be understood, that the embodiments shown in the drawings and described above are merely for illustrative purposes only and not intended to limit the scope of the invention which is defined by the claims which follow.

I claim:

1. A processing reactor for processing a semiconductor substrate, said reactor comprising:
    a reactor housing defining a processing chamber;
    a platform rotatably supported in said housing for rotatably supporting the substrate in said processing chamber; and
    a gas injection assembly adapted to inject at least one gas into said processing chamber and onto the substrate when said platform rotates the substrate, said gas injection assembly having a substrate facing surface for facing a device side of the substrate, and said substrate facing surface being adapted to vary the dynamic pressure in said processing chamber and across the substrate during processing wherein the velocity of the gas varies across the substrate to vary the processing time of the substrate in said processing chamber.

2. The reactor according to claim 1, wherein said substrate facing surface is repositionable in said processing chamber toward or away from said platform to thereby vary the space between said substrate facing surface and the substrate during processing to vary the dynamic pressure in said processing chamber.

3. The reactor according to claim 1, wherein said gas injection assembly includes a gas injection manifold, said gas injection manifold including said substrate facing surface.

4. The reactor according to claim 3, wherein said gas injection manifold is movably mounted in said housing to vary the dynamic pressure in said processing chamber.

5. A processing reactor for processing a semiconductor substrate, said reactor comprising:
    a reactor housing defining a processing chamber;
    a platform rotatably supported in said housing for rotatably supporting the substrate in said processing chamber; and
    a gas injection assembly adapted to inject at least one gas into said processing chamber and onto the substrate when said platform rotates the substrate, said gas injection assembly having a substrate facing surface for facing a device side of the substrate, and said substrate facing surface being adapted to vary the dynamic pressure in said processing chamber and across the substrate during processing wherein the velocity of the gas varies across the substrate to vary the processing time of the substrate in said processing chamber wherein said substrate facing surface includes at least one angled portion with respect to said platform, said angled portion varying the dynamic pressure in said processing chamber and wherein said gas injection assembly includes at least one port for injecting a first gas into said processing chamber through said substrate facing surface.

6. The reactor according to claim 5, wherein said angled portion comprises a first angled portion, said substrate facing surface including a second angled portion.

7. The reactor according to claim 6, wherein said angled portions are joined to form an apex.

8. The reactor according to claim 7, wherein said apex is positioned for being centrally aligned over the substrate.

9. The reactor according to claim 6, wherein each of said first and second angled portions includes a planar surface.

10. A processing reactor for processing a semiconductor substrate, said reactor comprising:
    a reactor housing defining a processing chamber;
    a platform rotatably supported in said housing for rotatably supporting the substrate in said processing chamber; and
    a gas injection assembly adapted to inject at least one gas into said processing chamber and onto the substrate when said platform rotates the substrate, said gas injection assembly having a substrate facing surface, and said substrate facing surface including means for varying the dynamic pressure in said processing chamber and across the substrate during processing wherein the velocity of the gas varies across the substrate to vary the processing time of the substrate in said processing chamber, said gas injection assembly including at least one port for injecting a first gas into said processing chamber, and wherein said port is located in said substrate facing surface.

11. The reactor according to claim 10, wherein said port is centrally located in said substrate facing surface.

12. The reactor according to claim 10, wherein said port comprises a first port, said gas injection assembly including a second port for injecting a second gas into said processing chamber.

13. The reactor according to claim 12, wherein said first port and said second port are coaxial.

14. The reactor according to claim 10, wherein said gas injection manifold is adapted to move between at least two operable positions toward or away from said platform to vary the space between the substrate and the substrate facing surface within said processing chamber during processing to vary the dynamic pressure in said processing chamber.

15. The reactor according to claim 10, wherein said port comprises a first port, said gas injection assembly including a second port for injecting a second gas into said processing chamber.

16. The reactor according to claim 15, wherein said first port and said second port are co-axial.

17. The reactor according to claim 10, wherein said housing includes a cover, said gas manifold being supported in said cover.

18. The reactor according to claim 17, wherein said gas manifold is movably mounted in said cover to permit repositioning of said substrate facing surface toward or away from said platform to thereby vary the space between said substrate facing surface and the substrate.

19. The reactor according to claim 10, wherein said substrate facing surface includes a rectangular perimeter.

20. The reactor according to claim 19, wherein said perimeter includes opposed sides spaced inwardly from said platform whereby said substrate facing surface extends only over a portion of the substrate.

21. The reactor according to claim 10, wherein gas injection assembly includes an exhaust manifold for exhausting gases from said processing chamber.

22. A processing reactor for processing a semiconductor substrate, said processing reactor comprising:
- a housing, said housing including a processing chamber;
- a platform rotatably supported in said housing for rotatably supporting the substrate in said processing chamber;
- a heater adapted to heat the substrate; and
- a gas manifold having a substrate facing surface for facing a device side of the substrate, said substrate facing surface having a rectangular perimeter, said gas manifold having at least one injection port for injecting gas into the processing chamber, and said substrate facing surface being adapted to vary the dynamic pressure in said processing chamber and across the substrate wherein the gas velocity of the gas varies across the device side of the substrate to vary the processing time for the substrate.

23. The processing reactor according to claim 22, wherein said substrate facing surface is repositionable in said processing chamber toward or away from said platform during processing to vary the dynamic pressure in said processing chamber during processing.

24. A processing reactor for processing a semiconductor substrate, said processing reactor comprising:
- a housing, said housing including a processing chamber;
- a platform rotatably supported in said housing for rotatably supporting the substrate in said processing chamber;
- a heater adapted to heat the substrate; and
- a gas manifold having a substrate facing surface for facing a device side of the substrate, said substrate facing surface having a rectangular perimeter, said gas manifold having at least one injection port for injecting gas into the processing chamber, and wherein said substrate facing surface includes first and second portions, at least one of said first and second portions being angled with respect to said platform to vary the dynamic pressure in said processing chamber and across the substrate wherein the gas velocity of the gas varies across the device side of the substrate to vary the processing time for the substrate, said substrate facing surface being repositionable in said processing chamber toward or away from said platform during processing to vary the dynamic pressure in said processing chamber during processing.

25. The processing reactor according to claim 23, wherein both said first and second portions are angled with respect to said platform.

26. The processing reactor according to claim 22, wherein said injection port comprises a first injection port, said gas manifold including a second injection port.

27. The processing reactor according to claim 20, wherein said first and second ports are coaxial.

28. The processing reactor according to claim 27, wherein said substrate facing surface includes first and second portions, at least one of said first and second portions being angled with respect to said platform.

29. The processing reactor according to claim 28, wherein said first and second portions are angled to form a positive wedge-shaped substrate facing surface.

30. The processing reactor according to claim 28, wherein said first and second angled portions are angled to form a negative wedge-shape substrate facing surface.

31. The processing reactor according to claim 22, wherein said housing includes a cover, said gas manifold being supported in said cover.

32. The processing reactor according to claim 31, wherein said gas manifold is movably mounted in said cover to permit repositioning of said substrate facing surface relative to said platform during processing.

33. The processing reactor according to claim 22, wherein said gas manifold is generally rectangular.

34. The processing reactor according to claim 33, wherein said substrate facing surface is generally rectangular and includes one of a positive wedge-shape surface and a negative wedge-shape surface.

35. A processing reactor for processing a semiconductor substrate, said processing reactor comprising:
- a reactor housing, said reactor housing including a processing chamber;
- a heater housing rotatably supported in said first housing;
- a platform supported on said heater housing for rotatably supporting the substrate in said processing chamber;
- a heater positioned in said heater housing and being adapted to heat the substrate; and
- a gas manifold having a substrate facing surface and at least one gas injection port for injecting gas axially onto the substrate through said substrate facing surface, and said substrate facing surface including means for varying the dynamic pressure in said processing chamber and across the substrate during processing wherein the velocity of the gas varies across the substrate to vary the processing time for the substrate.

36. The processing reactor according to claim 35, wherein said gas manifold is supported in a gas injection assembly housing, said gas injection assembly housing supporting said gas manifold in said reactor housing.

37. The process reactor according to claim 36, wherein said gas manifold is movably supported in said transverse passage.

38. The process reactor according to claim 35, wherein said injection assembly housing includes a-transverse passage, said gas manifold, being positioned and supported in said transverse passage.

39. The process reactor according to claim 36, wherein said gas injection assembly housing further supports a gas exhaust manifold for exhausting gases from said processing chamber.

40. The process reactor according to claim 38, wherein said gas exhaust manifold extends around said gas injection manifold to isolate gas injected through said gas injection port on a discrete area of the substrate.

41. The process reactor according to claim 35, wherein said means comprises one of a positive wedge-shape facing surface and a negative wedge-shaped facing surface.

42. A processing reactor for processing a semiconductor substrate, said processing reactor comprising:
- a reactor housing defining a processing chamber;
- a substrate support for rotatably supporting a substrate in said processing chamber;
- a heater for heating the substrate in said processing chamber; and
- a gas injection system for injecting at least one gas into said processing chamber, said gas injection system including a gas injection manifold having a substrate facing surface and at least one gas injection port for injecting gas in to said processing chamber, said substrate facing surface facing said platform for facing a device side of the substrate, said gas injection manifold being movably mounted in said housing during processing wherein said substrate facing surface is movable toward or away from the device side of the substrate during processing to vary the dynamic pressure in said processing chamber and includes a pair of angled portions defining an apex therebetween, said angled portions varying the dynamic pressure across the substrate to thereby vary the gas velocity across the substrate during processing.

43. The processing reactor according to claim 42, wherein said substrate facing surface is one of a positive wedge-shape surface and a negative wedge-shape surface.

44. The processing reactor according to claim 43, wherein said gas injection manifold includes a plurality of injection ports for injecting the processing gas into said processing chamber.

45. The processing reactor according to claim 42, wherein said gas injection system further includes an exhaust manifold having a plurality of exhaust ports for exhausting gasses from said processing chamber, said exhaust ports extending around said gas injection manifold.

46. The processing reactor according to claim 45, wherein said gas injection manifold comprises a rectangular shaped manifold.

47. The processing reactor according to claim 46, wherein said gas injection manifold includes a plurality of injection ports.

48. A The processing reactor according to claim 42, wherein said injection port is positioned at said apex.

49. The processing reactor according to claim 48, wherein said gas injection manifold includes a pair of gas injection ports.

50. The processing reactor according to claim 49, wherein said injection ports are coaxial.

51. A processing reactor for processing a semiconductor substrate, said processing reactor comprising:
a housing, said housing including a processing chamber;
a platform rotatably supported in said housing for rotatably supporting the substrate in said processing chamber;
a heater adapted to heat the substrate; and
a gas manifold having a substrate facing surface for facing a device side of the substrate, said substrate facing surface having a rectangular perimeter, said gas manifold having at least one injection port for injecting gas into the processing chamber, and wherein said substrate facing surface includes first and second portions, at least one of said first and second portions being angled with respect to said platform to vary the dynamic pressure in said processing chamber and across the substrate wherein the gas velocity of the gas varies across the device side of the substrate to vary the processing time for the substrate, said substrate facing surface being repositionable in said processing chamber toward or away from said platform during processing to vary the dynamic pressure in said processing chamber during processing wherein said injection port is positioned between said first and second portions.

52. A substrate processing apparatus comprising:
a housing defining a processing chamber;
a platform rotatably supported in said housing for rotatably supporting the substrate in said processing chamber; and
a gas injection assembly adapted to inject at least one gas into said processing chamber and onto the substrate at least while the substrate is processed, said gas injection assembly having a substrate facing surface for facing the substrate, said substrate facing surface having a rectangular perimeter, opposed sides of said perimeter being spaced inwardly from said platform whereby said substrate facing surface extends only over a portion of the substrate, and said substrate facing surface being adapted to vary including means for varying the dynamic pressure in said processing chamber during processing to vary the gas velocity across the substrate to vary the processing time of the substrate in said processing chamber.

53. The substrate processing apparatus according to claim 52, wherein said substrate facing surface is repositionable in said processing chamber during processing to vary the dynamic pressure in said processing chamber during processing.

54. The substrate processing apparatus according to claim 52, wherein said means includes at least one angled portion with respect to said platform, said angled portion varying the dynamic pressure in said processing chamber.

55. The substrate processing apparatus according to claim 54, wherein said angled portion comprises a first angled portion, said substrate facing surface including a second angled portion.

56. The substrate processing apparatus according to claim 55, wherein said angled portions comprise one of a positive wedge-shaped substrate facing surface and a negative wedge-shaped substrate facing surface.

57. The substrate processing apparatus according to claim 52, wherein saidinjection assembly includes a transverse passage, said substrate facing surface being positioned in said transverse passage.

58. The substrate processing apparatus according to claim 57, wherein said substrate facing surface is movably supported in said transverse passage.

59. A manufacturing method for a semiconductor device, said method comprising:
processing the semiconductor substrate using a substrate processing apparatus, the substrate processing apparatus comprising:
a housing defining a processing chamber;
a platform rotatably supported in said housing for rotatably supporting the substrate in said processing chamber; and
a gas injection assembly adapted to inject at least one gas into said processing chamber and onto the substrate at least while the substrate is processed, said gas injection assembly having a substrate facing surface, and said substrate facing surface being adapted to vary the dynamic pressure across the substrate in said processing chamber during processing wherein the velocity of the gas varies across the substrate during processing to vary the processing time of the substrate in said processing chamber.

* * * * *

UNITED STATES PATENT AND TRADEMARK OFFICE
CERTIFICATE OF CORRECTION

PATENT NO. : 6,544,339 B1  Page 1 of 1
APPLICATION NO. : 09/532588
DATED : April 8, 2003
INVENTOR(S) : Imad Mahawili It is certified that error appears in the above-identified patent and that said Letters Patent is hereby corrected as shown below:

Column 9:
Line 27, Claim 1, Insert --wedge-shaped-- before "substrate".

Column 11:
Line 9, Claim 22, Insert --wedge-shaped-- before "substrate".
Line 53, Claim 27, "20" should be --26--.

Column 12:
Line 20, Claim 35, Insert --wedge-shaped-- before "substrate".
Line 36, Claim 38, "a-transverse" should be --a transverse--.

Column 13:
Line 25, Claim 48, Delete "A" before --The--.

Column 14:
Line 33, Claim 57, "saidinjection" should be --said injection--.

Signed and Sealed this

Third Day of February, 2009

JOHN DOLL
*Acting Director of the United States Patent and Trademark Office*